United States Patent
Juchem

(10) Patent No.: US 7,459,908 B2
(45) Date of Patent: Dec. 2, 2008

(54) PASSIVE SHIMMING FOR MR SPECTROSCOPY AT HIGH MAGNETIC FIELDS

(75) Inventor: Christoph Juchem, Tubingen (DE)

(73) Assignee: Max-Planck-Gesellschaft zur Forderung der Wissenschaften E.V. (DE)

( * ) Notice: Subject to any disclaimer, the term of this patent is extended or adjusted under 35 U.S.C. 154(b) by 55 days.

(21) Appl. No.: 11/515,620

(22) Filed: Sep. 5, 2006

(65) Prior Publication Data

US 2008/0054902 A1    Mar. 6, 2008

(51) Int. Cl.
*G01V 3/00* (2006.01)

(52) U.S. Cl. .................. 324/320; 324/319

(58) Field of Classification Search .......... 324/320, 324/319, 318
See application file for complete search history.

(56) References Cited

U.S. PATENT DOCUMENTS

| | | | |
|---|---|---|---|
| 5,045,794 A * | 9/1991 | Dorri et al. ............. | 324/320 |
| 5,532,597 A | 7/1996 | McGinley et al. | |
| 5,635,839 A * | 6/1997 | Srivastava et al. ...... | 324/320 |
| 5,677,854 A | 10/1997 | Dorri | |
| 6,181,137 B1 * | 1/2001 | Havens et al. .......... | 324/320 |
| 6,294,972 B1 | 9/2001 | Jesmanowicz et al. | |
| 6,529,005 B1 * | 3/2003 | Kasten et al. .......... | 324/320 |
| 6,897,750 B2 | 5/2005 | Neuberth | |

OTHER PUBLICATIONS

Vanhamme et al., "MR spectroscopy quantitation: a review of time-domain methods", NMR Biomed., vol. 14 (2001), pp. 233-246.

Mierisova et al., "MR spectroscopy quantitation: a review of frequency domain methods", NMR Biomed., vol. 14 (2001), pp. 247-259.

Stoyanova et al., "NMR spectral quantitation by principal component analysis", NMR Biomed., vol. 14 (2001), pp. 271-277.

Romeo et al., "Magnet Field Profiling: Analysis and Correcting Coil Design", Magnetic Resonance in Medicine, vol. 1 (1984), pp. 44-65.

Jesmanowicz et al., "Local Ferroshims Using Office Copier Toner", Intl. Soc. Mag. Reson. Med. 9 (2001), p. 617.

(Continued)

*Primary Examiner*—Louis M Arana
(74) *Attorney, Agent, or Firm*—Caesar, Rivise, Bernstein, Cohen & Pokotilow, Ltd.

(57) ABSTRACT

A method of providing shim sheets for adjusting a magnetic field in a magnetic resonance device by passive shimming, comprises the steps of field mapping of a region of interest in the MR device for obtaining an uncorrected magnetic field distribution including field inhomogeneities, decomposing the field inhomogeneities into first and second order spherical harmonic functions, determining primary shim terms derived from the second order spherical harmonic functions, wherein the primary shim terms yield a passive shim field adapted to a targeted shim field, scaling optimized shim terms for increasing a similarity of the passive shim field with the targeted shim field, constructing modular shim sheets on the basis of the optimized shim terms, and mounting the modular shim sheets on a shim sheet carrier of the magnetic resonance device. Furthermore, an adjustment device for adjusting a magnetic field in a magnetic resonance device by passive shimming is described.

24 Claims, 4 Drawing Sheets
(2 of 4 Drawing Sheet(s) Filed in Color)

OTHER PUBLICATIONS

Hillenbrand et al., "High-Order MR Shimming: a Simulation Study of the Effectiveness of Competing Methods, Using an Established Susceptibility Model of the Human Head", Appl. Magn. Reson., vol. 29 (2005), pp. 39-64.

Wilson et al., "Optimization of Static Field Homogeneity in Human Brain Using Diamagnetic Passive Shims", Magnetic Resonance in Medicine, vol. 48 (2002), pp. 906-914.

Wilson et al., "Utilization of an Intra-Oral Diamagnetic Passive Shim in Functional MRI of the Inferior Frontal Cortex", Magnetic Resonance in Medicine, vol. 50 (2003), pp. 1089-1094.

Cusack et al., "An evaluation of the use of passive shimming to improve frontal sensitivity in fMRI", NeuroImage. vol. 24 (2005), pp. 82-91.

Konzbul et al., "Shim coils for NMR and MRI solenoid magnets", Meas. Sci. Technol., vol. 6 (1995), pp. 1116-1123.

Brideson et al., "Determining Complicated Winding Patterns for Shim Coils Using Stream Functions and the Target-Field Method", Concepts Magn. Reson., vol. 14 (2002), pp. 9-18.

Brideson et al., "Winding patterns for actively shielded shim coils with asymmetric target-fields", Meas. Sci. Technol., vol. 14 (2003), pp. 484-493.

Gruetter et al., "Fast, Noniterative Shimming of Spatially Localized Signals, In Vivo Analysis of the Magnetic Field along Axes", Journal of Magnetic Resonance, vol. 96 (1992), pp. 323-334.

Chen et al., "Measurement and automatic correction of high-order B0 inhomogeneity in the rat brain at 11.7 Tesla", Magnetic Resonance Imaging, vol. 22 (2004), pp. 835-842.

Ugurbil et al., "Ultrahigh field magnetic resonance imaging and spectroscopy", Magnetic Resonance Imaging, vol. 21 (2003), pp. 1263-1281.

Gruetter et al., "Resolution Improvements in in Vivo 1H NMR Spectra with Increased Magnetic Field Strength", Journal of Magnetic Resonance, vol. 135 (1998), pp. 260-264.

Tkac et al., "In Vivo 1H NMR Spectroscopy of the Human Brain at 7 T", Magnetic Resonance in Medicine, vol. 46 (2001), pp. 451-456.

Juchem et al., "Region and volume dependencies in spectral line width assessed by (1)H 2D MR chemical shift imaging in the monkey brain at 7 T", Magnetic Resonance Imaging, vol. 22 (2004), pp. 1373-1383.

Pfeuffer et al., "Anantomical and functional MR imaging in the macaque monkey using a vertical large-bore 7 Tesla setup", Magnetic Resonance Imaging, vol. 22 (2004), pp. 1343-1359.

Logothetis et al., "Functional imaging of the monkey brain", Nature Neuroscience, vol. 2 (1999), pp. 555-562.

Pfeuffer et al., "High-field localized (1)H NMR spectroscopy in the anesthetized and in the awake monkey", Magnetic Resonance Imaging, vol. 22 (2004), pp. 1361-1372.

Cusack et al., "New Robust 3-D Phase Unwrapping Algorithms: Applications to Magnetic Field Mapping and Undistorting Echoplanar Images", NeuroImage, vol. 16 (2002), pp. 754-764.

Clare et al., "Requirements for Room Temperature Shimming of the Human Brain", Magnetic Resonance in Medicine, vol. 55 (2006), pp. 210-214.

Muller-Bierl et al., "Numerical modeling of needle tip artifacts in MR gradient echo imaging", Med. Phys., vol. 31 No. 3 (2004), pp. 579-587.

Muller-Bierl et al., "Compensation of magnetic field distortions from paramagnetic instruments by added diamagnetic material: Measurements and numerical simulations", Med. Phys., vol. 32 No. 1 (2005), pp. 76-84.

Koch et al., "Adjustable Subject-Specific Passive Shims using Optimized Distributions of Bismuth and Zirconium", Proc. Intl. Soc. Mag. Reson. Med., vol. 14 (2006), p. 519.

Wen et al., "An in Vivo Automated Shimming Method Taking into Account Shim Current Constraints", MRM, vol. 34 (1995), pp. 898-904.

Spielman et al., "Quantitative Assessment of Improved Homogeneity Using Higher-order Shims for Spectroscopic Imaging of the Brain", MRM, vol. 40 (1998), pp. 376-382.

* cited by examiner

PASSIVE SHIMMING FOR MR SPECTROSCOPY AT HIGH MAGNETIC FIELDS

FIELD OF THE INVENTION

The invention relates to a method of providing shim sheets for adjusting a magnetic field in a magnetic resonance device (MR device) by passive shimming, a method for adjusting the magnetic field with the shim sheets, an adjustment device for adjusting the magnetic field in the MR device by passive shimming, and to the MR device including the adjustment device.

BACKGROUND ART

Magnetic resonance spectroscopy (MRS) is used in e. g. analytical chemistry to retrieve detailed information about chemicals, but also for non-invasive in vivo experiments in biology and medicine to obtain quantitative information about biologically active compounds. Specifically, in the rapidly evolving field of neuroscience, MRS is of great importance, because it allows the assessment of neuro-chemical profiles of individual brain regions.

A non-homogeneous distribution of the magnetic field strength within the sensitive probe volume leads to broadening of spectral peaks and a reduction of the signal-to-noise ratio (SNR). Furthermore, the distribution of the magnetic field has a direct impact on the line shape of spectral peaks, which may lead to quantification errors, if inappropriate model functions are used. If magnetically susceptible probes are placed into the homogeneous field of an MR scanner, the field distribution often becomes inhomogeneous and a local distribution of field gradients is added. By correcting (adjusting) the field distribution, it can be made homogeneous with the probe inside the MR device ('shimming'), in particular in the axial direction of a gradient device of the MR device (cartesian z-direction).

Shimming can be achieved by placement of configurations of ferromagnetic objects with proper size and positioning into the magnetic field in order to improve the field homogeneity within the sensitive probe volume (so-called 'passive shimming'). Passive shimming is used e. g. to improve the field homogeneity of the MR scanner and also to account for subject induced field distortions (see e. g. F. Romeo et al. in "Magn. Reson. Med." 1984. 1(1): p. 44-65; J. V. M. McGinley et al. in U.S. Pat. No. 5,532,597; B. Dorri in U.S. Pat. No. 5,677,854; G. Neuberth in U.S. Pat. No. 6,897,750, A. Jesmanowicz et al. in ISMRM, Annual Meeting 2001, Glasgow/Scotland, and D. F. Hillenbrand et al. in "Appl. Magn. Reson.", 2005. 29: p. 39-64).

Conventional passive shimming has a drawback in terms of complexity of constructing the ferromagnetic object configurations and flexibility for adapting to varying measurement condition. In particular, the physical mounting of many metal pieces on a carrier is time consuming and inflexible. As an example, the technique of A. Jesmanowicz et al. requires exact mounting of more than 700 metal pieces on a carrier. Therefore, the practical use of passive shimming has been limited to special applications like the use of intra-oral passive shimming of the frontal cortex via diamagnetic mouth inserts (see e. g. J. L. Wilson et al. in "Magn. Reson. Med." 2002. 48(5): p. 906-14; J. L. Wilson et al. in "Magn. Reson. Med." 2003, 50(5): p. 1089-94; and R. Cusack et al. in "Neuroimage" 2005, 24(1): p. 82-91).

Furthermore, shimming can be achieved by shim fields generated with electro-magnetic coils arranged around the sensitive probe volume (so-called 'active shimming'). Active shimming was developed to provide highly accurate field cancellation with a flexible interface. Magnetic fields, as vector fields, can be fully described by spherical harmonic functions. Accordingly, deviations from homogeneity can also be expressed on that basis. With a set of appropriate electomagnetic coils, each generating a magnetic field component that corresponds to one spherical harmonic, the field inhomogeneity can be minimized by superposition of a shim field of the same magnitude but opposite sign to the distortion (see e.g. F. Romeo et al. in "Magn. Reson. Med." 1984. 1(1): p. 44-65; P. Konzbul et al. in "Meas. Sci. Technol.", 1995. 6: p. 1116-1123; M. A. Brideson et al. in "Concepts in Magnetic Resonance", 2001. 14: p. 9-18; and M. A. Brideson et al. in "Meas. Sci. Technol.", 2003. 14: p. 484-493).

Conventional active shimming has a restriction in high field strength applications. However, there is a continuous trend towards the use of higher magnetic fields for both research and clinical scanners, since the SNR improves at least linearly in MR imaging and spectroscopy with increased magnetic field. Furthermore, higher fields lead to better spectral dispersion in MR spectroscopy, which is advantageous particularly for the separation of glutamate (Glu) from glutamine (Gln) or creatine (Cr) from phosphocreatine (PCr) in $^1$H MRS of brain metabolites.

However, the benefit of better SNR and simplified spectra at high field can only be exploited if optimal shimming is achieved, as field distortions due to susceptibility effects also increase at higher field strength. Increased field distortions require stronger shim fields, potentially exceeding the capabilities of the conventional active shim devices. In addition, regions of strongly differing magnetic susceptibilities like tissue-air transitions, e.g. in the vicinity of the ear canals or the cranial bone, may also require shim fields beyond those provided by active shimming. In practice, zero order terms, i.e. a field offsets, that are small compared to the scanner field strength do not pose problems and first order terms can be easily shimmed using the scanners gradient system. The second order terms, however, pose the main bottleneck in conventional experimental setups when the shim requirements exceed the capabilities of the corresponding active shim device.

OBJECTIVE OF THE INVENTION

The objective of the invention is to provide an improved shimming method, in particular for adjusting a magnetic field in an MR device, which methods is capable to avoid disadvantages of the prior art techniques. Furthermore, the objective of the invention is to provide an improved adjustment device for shimming adjustment of a magnetic field in an MR device.

SUMMARY OF THE INVENTION

According to a first aspect of the invention, the above objective is solved by a method of providing shim sheets for adjusting a magnetic field in a MR device by passive shimming with modular shim sheets constructed on the basis of second order spherical harmonic functions, which compensate magnetic field inhomogeneities in a region of interest in the MR device. In particular, the method comprises the steps of field mapping the region of interest for obtaining an uncorrected magnetic field distribution including the field inhomogeneities, decomposing the field inhomogeneities into first and second order spherical harmonic functions, determining primary shim terms derived from the second order spherical harmonic functions, wherein the primary shim terms yield a passive shim field adapted to a targeted shim field, scaling optimized shim terms for increasing a similarity of the passive shim field with the targeted shim field, and constructing the modular shim sheets on the basis of the optimized shim terms.

Advantageously, the inventive method allows to derive simple modular geometries of ferro-magnetic shim sheets and to optimize the geometry numerically so that a complete set of second order spherical harmonic shim functions can be generated. The inventive method provides an improved shim design with a maximization of shim field accuracy and ease of practical implementation. The inventive method increases the sensitivity and spectral dispersion in magnetic resonance spectroscopy (MRS), in particular in MRS of brain metabolites.

The invention has particular advantages in application of magnetic fields having a field strength yielding a saturation of a metal or metal alloy used for constructing the shim sheets. In this case, the reproducibility of the passive shim fields is improved. Preferably, the magnetic field strength is larger than 0,4 T. Practical limitations from susceptibility-induced field distortions are also increased at higher magnetic field strength. Contrary to the conventional techniques, these limitations can be overcome with the invention. Furthermore, even strong limitations of the active shim capabilities can be overcome by the invention.

As further steps, the inventive method comprises mounting the modular shim sheets on a carrier and arranging the carrier in the MR device. Preferably, the theoretically optimized shim sheet geometries are mounted on a cylinder surface and placed inside a magnet bore of the MR device, surrounding the subject's head and the RF coil. Passive shimming according to the invention generates very strong shim fields and coarsely removes field distortions.

The cylindrical geometry used as the basic design module has advantages in terms of most simple shim sheet geometries for minimal shim sheet masses. On the contrary, the basic design module for the generation of shim fields by passive shimming used in by Romeo et al. (see above) was a sphere.

In the present specification, the term 'primary shim term' refers to a function corresponding to one of the second order spherical harmonic functions. The term 'optimized shim term' refers to an adapted function yielding a shim field being improved in terms of compensating field inhomogeneities. The term 'modular shim sheets' refers to any magnetic materials formed for providing shim fields according to one of the second order spherical harmonic functions. Each modular shim sheet corresponds to a particular optimized shim term. The first order spherical harmonic components (terms) are called X, Z, Y (n=1, m=1, 0, −1), while the second order spherical harmonic components (terms) are called $X2$-$Y2$, $ZX$, $Z2$, $ZY$, $XY$ (n=2, m=2, 1, 0, −1, −2) as described in detail below.

According to a second aspect of the invention, the above objective is solved by a method of adjusting a magnetic field in a MR device by passive shimming, comprising the steps of providing the shim sheet carrier with modular shim sheets with the above method according to the first aspect of the invention and operating the MR device with the shim sheet carrier surrounding a sample under investigation. As a further essential advantage of the invention, the above construction of modular shim sheets is necessary once in an application only. The adjustment of the magnetic field in the MR device is maintained during further measurements with the sample.

According to a third aspect of the invention, the above objective is solved by an adjustment device for passive shimming, which comprises modular shim sheets constructed on the basis of the second order spherical harmonic functions representing the magnetic field inhomogeneities in the MR device. In particular, the adjustment device comprises at least one of a plurality of modular shim sheets each being constructed on the basis of one of $X2$-$Y2$, $ZX$, $Z2$, $ZY$ and $XY$ components of the spherical harmonic functions. The modular shim sheets include at least one strip sheet corresponding to at least one of the $X2$-$Y2$ and $XY$ components of the spherical harmonic functions, at least one circle sheet corresponding to the $Z2$ component of the spherical harmonic functions, and at least one quarter-circle sheet corresponding to at least one of the $ZX$ and $ZY$ components of the spherical harmonic functions. Furthermore, the adjustment device comprises a carrier supporting the modular shim sheets.

According to a fourth aspect of the invention, the above objective is solved by an MR device including the adjustment device of the invention.

In the present specification, the term 'strip sheet' refers to a straight strip-shaped magnetic material, while the terms 'circle sheet' and 'quarter-circle sheet' refer to a curved strip-shaped magnetic material extending along a circle, each being formed for providing a shim field according to one of the second order spherical harmonic functions. The quarter-circle sheet extends along a portion of a circle line covering an angle range of 80° to 100°, preferably 90°.

According to a preferred embodiment of the invention, the primary shim terms correspond to at least one of $X2$-$Y2$, $ZX$, $Z2$, $ZY$ and $XY$ components of spherical harmonic functions. Particularly preferred, the primary shim terms are derived from all the above $X2$-$Y2$, $ZX$, $Z2$, $ZY$ and $XY$ components of the spherical harmonic functions.

If according to particularly preferred embodiments of the invention, the at least one strip sheet is constructed corresponding to a combination of the $X2$-$Y2$ and $XY$ components and a $-Z2$ component of the spherical harmonic functions and/or the at least one circle sheet is constructed as one single circle sheet, advantages in terms of reducing the mass of the shim sheets without a loss in shim field strength can be obtained. 'Strip sheets' constructed corresponding to the combined $X2$-$Y2$/$XY$ and $-Z2$ components are also called 'shim blocks'.

According to a further preferred embodiment of the invention, optimized masses of the at least one of the strip, the circle and the quarter-circle sheets (or the corresponding shim blocks) are selected. Particularly preferred is a selection on the basis of a predetermined, device-specific reference table.

Preferably, each of the modular shim sheets comprises a plurality of stacked or sandwiched sheet layers. Advantageously, sheet layers can be easily combined for providing the selected optimized masses. Particularly preferred is an embodiment, wherein at least one of a sheet layer thickness and a sheet layer distance is selected for providing the optimized masses.

If the passive shim fields are calculated on the basis of a dipole model, advantages in terms of facilitating the calculation are obtained. In particular, the shim terms are discretized by a finite number of finite sized volume elements, to each of which a dipole field is attached, wherein the passive shim field is calculated as a superposition of the fields of the individual dipole fields. Preferably, the primary shim terms are selected such that the related passive shim fields are adapted to the targeted shim fields compensating the field inhomogeneities in the MR device, in particular in the z-direction.

According to a particularly advantageous feature of the invention the step of calculating optimized shim terms comprises the sub-steps of calculating a quantitative measure of the similarity of the passive shim field with the targeted shim field, and iterative varying the primary shim terms for optimizing (e. g. minimizing) the quantitative measure. The inventor has found a modified classical Pearson-product-moment correlation $R^2$ as an advantageous representation of the similarity of the practical passive shim field and the theoretical targeted shim field.

According to a further preferred embodiment of the invention, the magnetic field adjustment method comprises a further correction of the magnetic field in the MR device by active shimming. The inventor has developed a combined passive and active shim approach, which allows further to optimize the shim field by flexible and highly accurate active shimming.

In an experimental approval, the passive shimming procedure was first evaluated theoretically, then applied in phantom studies and subsequently validated for in vivo $^1$H MRS in the macaque visual cortex. No artifacts due to the passive shim setup were observed and adjustments were reproducible between sessions. The feasibility of very strong, flexible and high quality shimming via the combined approach of passive and active shimming is of high practical relevance for MR imaging and spectroscopy at high fields where shim power is limited or where shimming of specific anatomical regions inherently requires strong shim fields.

For providing the adjustment device of the invention, each of the modular shim sheets preferably comprises one or more sheet layers, like e. g. a stack of sheet layers, which allows an optimized selection of the sheet mass in terms of adapting the shim field to the targeted field.

If the modular shim sheet comprise permalloy sheets (or mu metal sheets), a high shimming effectivity is obtained even at high field strengths. Permalloy has particular advantages in terms of high saturation magnetization and negligible coercivity/remanence, so that strong and reproducible shimming fields can be obtained with low masses.

The invention has the following further advantages. The passive (ferro-magnetic) shimming approach, optionally combined with the active (electronic) shimming approach generates strong, high-accuracy second order shim fields. Simple shimsheet (ferro-shim) geometries are theoretically derived and optimized for maximum field strength and accuracy. Compared to conventional pure shim-sheet approaches or the combination of passive and active shimming the ease of implementation represents an essential advantage. The placement of modular shim-sheet assemblies for the experimentally most relevant second order shim terms in close proximity to the subject allows the reproducible creation of shim fields many times larger than those of the scanner's built-in electronic shim device. Subsequently, active shimming with the scanner's active shim device provided flexible fine tuning of the shim fields to the particular experimental conditions. The power of the combined passive and active shimming approach to improve the quality of brain MRS can been applied in particular with shimming of the macaque's visual cortex in a high-field 7 T MR scanner.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Further details and advantages of the invention are described in the following with reference to the attached drawings, which show in.

PREFERRED EMBODIMENTS OF THE INVENTION

Embodiment of an MR Device of the Invention

Figure 1:
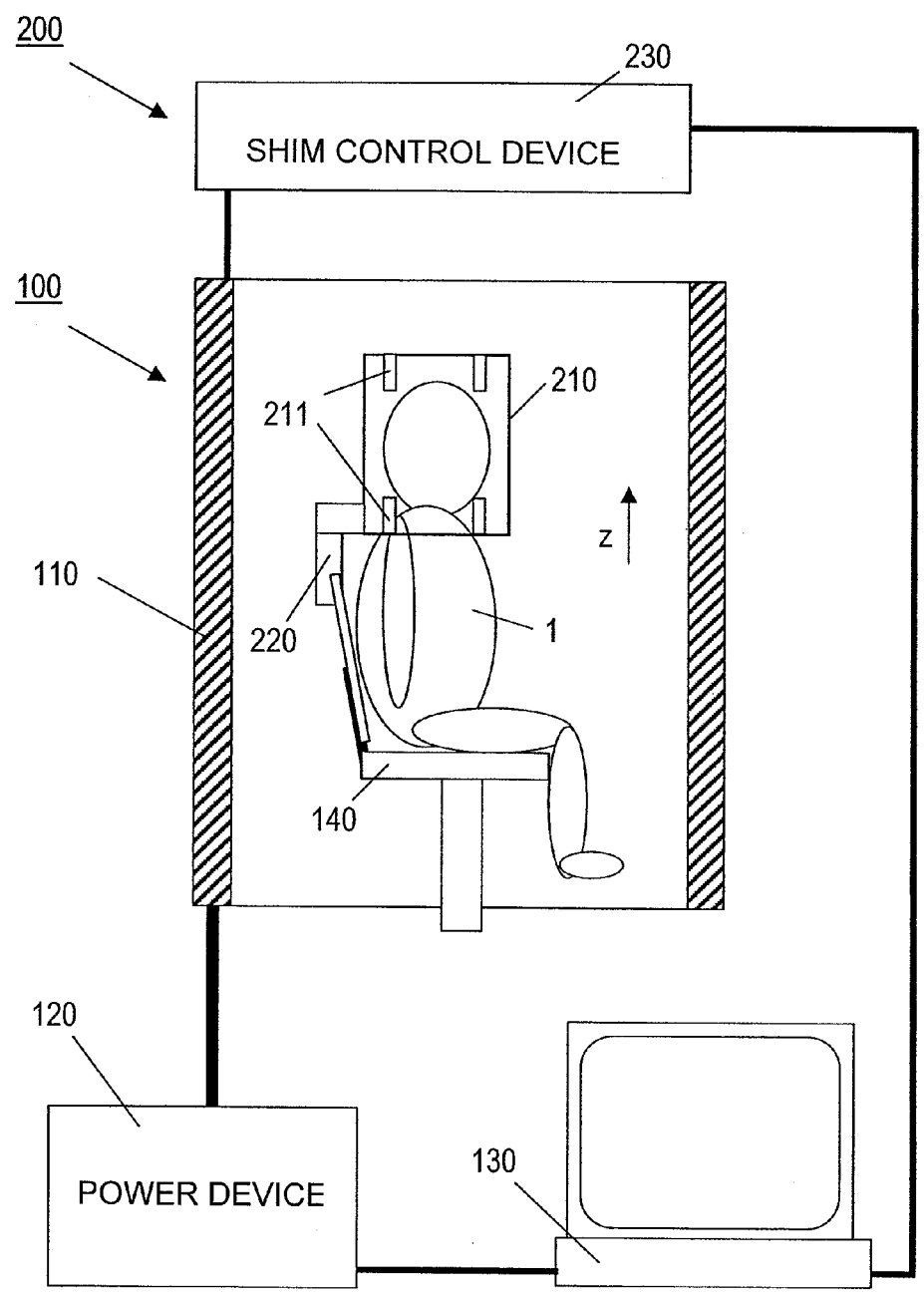
FIG. 1: a schematic representation of an MR device including an adjustment device according to the invention.

Reference is made to FIG. 1, which illustrates an MR device 100 including an adjustment device 200 according to a preferred embodiment of the invention. The MR device 100 comprises e. g. a 7 T/60 cm Bruker Biospec system (Bruker BioSpin, Ettlingen/Germany) equipped with a gradient device 110, like e. g. a Siemens gradient insert AC44 (40 mT/m, <200 µs, Siemens Medical Solutions, Erlangen/Germany), a power device 120 and a main control device 130. In the gradient device 110, a support 140 is positioned for accomodating a sample 1 to be investigated, like e. g. an anesthetized macaque monkey (Macaca mulatta).

A custom-made saddle coil (300 MHz) is used for spin excitation as described by J. Pfeuffer, et al. in "Magn. Reson. Imaging" vol. 22(10), 2004, p. 1343-59. Signal acquisition for spectroscopy is done with an actively-decoupled 30-mm surface coil (Bruker BioSpin, Ettlingen/Germany). Oblique geometry handling with respect to the laboratory co-ordinate system for MR imaging, shimming and spectroscopy is avoided by a 30 to 45 degree rotation of the monkey's head. The saddle coil is placed to the back of the monkey's head and the surface coil is positioned over the visual cortex of one hemisphere. For single voxel spectroscopy, a STEAM sequence was used (FOV 5×5×5 mm$^3$, TE 10 ms, TM 10 ms, TR 3 s) with VAPOR water suppression and outer volume suppression (OVS) as described by J. Pfeuffer et al. "Magn. Reson. Imaging" vol. 22(10), 2004, p. 1361-72.

The adjustment device 200 comprises a shim cylinder 210 (shim sheet carrier), a holding device 220 for positioning the shim cylinder 210 in the gradient device 110 and a shim control device 230, which is connected with the main control device 130. The shim cylinder 210 is made of a plastic material (e. g. length 34 cm, diameter 25 cm) carrying a plurality of modular shim sheets 211 (or: 212, 213, see FIG. 3C). Further details of the modular shim sheets 211, 212, 213 are described below.

For the generation of a passive shim setup, the field distribution of the region of interest is measured and the field inhomogeneities are decomposed into first and second order spherical harmonic functions. The required masses per shim term are calculated and an appropriate combination of layers is tightly fixed to the predefined positions on the surface of the shim cylinder 210. Then, the shim cylinder 210 is positioned with the holding device 220 on the support 140 (monkey chair) to surround the monkey head. It is positioned together with the subject 1 inside the magnet bore and the gradient system 110.

In order to modify the passive shimming for a first adjustment or later modifications, the shim cylinder 210 can be removed, modified and remounted onto the holding device 220 or directly on the support 140, and the support 140 with the monkey 1 can be brought back into the magnet.

Embodiment of a Method of Providing Shim Sheets

Figure 2:
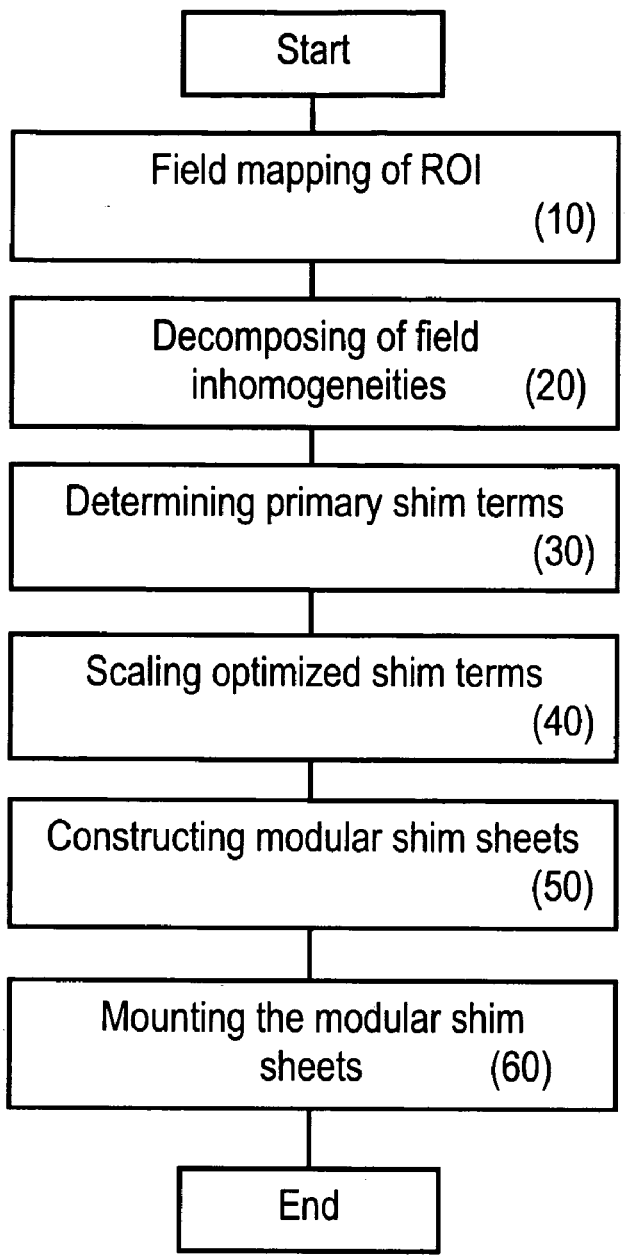
FIG. 2: a schematic representation of adjusting methods according to preferred embodiments of the invention.

With further details illustrated in FIG. 2, the method according to the invention comprises the steps of field mapping (step 10) of a region of interest, e. g. in the head of monkey 1, decomposing field inhomogeneities (step 20) measured with step 10 into first and second order spherical harmonic functions, determining primary shim terms (step 30) corresponding to the second order spherical harmonic functions contributing to the field inhomogeneities, which primary shim terms yield a passive shim field adapted to a targeted shim field, scaling optimized shim terms (step 40) for increasing a similarity measure of the passive shim field with the targeted shim field, and constructing modular shim sheets (211, see FIG. 1) on the basis of the optimized shim terms (step 50). As the result of steps 10 to 50, modular shim sheets are obtained, which adjust the magnetic field in the MR device 100 by compensating the field inhomogeneities. Finally, step 60 is added, which comprises mounting of the modular shim sheets on the shim cylinder carrier 210. In the following, further details of steps 10 to 60 are described.

Steps 10 and 20 (Field Mapping and Decomposing Field Inhomogeneities)

Magnetic fields are measured with the sample 1 inside the MR device 100 in two ways by using the saddle coil only: for full 3D field mapping, two FLASH images are acquired at different echo times of 7 and 9.5 ms (matrix 128×128×64, FOV 64×64×64 mm$^3$, TR 2 s) and the magnetic field is calculated from the corresponding phase images.

If necessary a 3D unwrapping is applied (see e. g. R. Cusack et al in "Neuroimage" vol. 16(3 Pt 1), 2002, p. 754-64), before the field distribution was fitted into first and second order spherical harmonic functions as described by H. Wen et al. in "Magn. Reson. Med." vol. 34(6), 1995, p. 898-904, and by S. Clare et al. in "Magn. Reson. Med." vol 55(1), 2005, p. 210-214. For the further adjustment of the passive shimming, magnetic fields were mapped and analyzed using the commercial software FASTMAP (see R. Gruetter et al. in "J. Magn. Reson." 1992. 96: p. 323-334) on 10×10×10 mm$^3$ to 15×15×15 mm$^3$ cube volumes.

Step 30 (Determining Primary Shim Terms)

The first order spherical harmonic components (terms) X, Z, Y (n=1, m=1, 0, −1) and the second order spherical harmonic components (terms) X2-Y2, ZX, Z2, ZY, XY (n=2, m=2, 1, 0, −1, −2) are summarized in the following table in Cartesian coordinates. The table illustrates the Cartesian description of the z-components of the first and second order spherical harmonic shim fields. The fields are normalized to a uniform minimum-to-maximum range of −1 to 1.

| abbreviation | order(n) | degree(m) | function |
| --- | --- | --- | --- |
| X | 1 | 1 | x |
| Z | 1 | 0 | z |
| Y | 1 | −1 | y |
| X2-Y2 | 2 | 2 | $x^2 - y^2$ |
| ZX | 2 | 1 | zx |
| Z2 | 2 | 0 | $z^2 - (x^2 + y^2)/2$ |
| ZY | 2 | −1 | zy |
| XY | 2 | −2 | xy |

Figure 3:
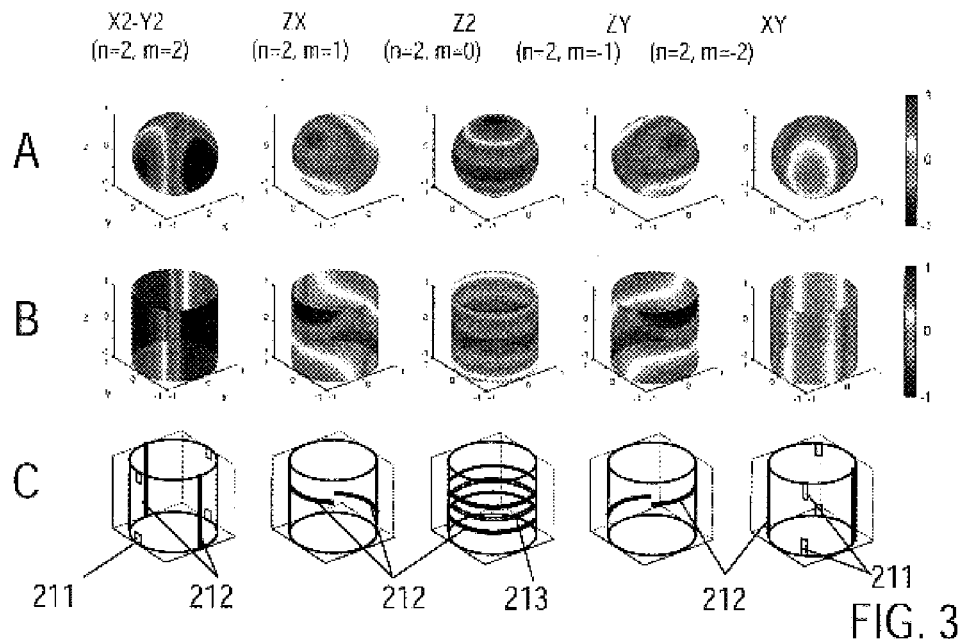
FIG. 3: a schematic representation of spherical harmonics and passive shim geometries.

The z-components of the first and second order spherical harmonic shim fields are 3D visualized in FIGS. 3A and 3B for a unity sphere and a cylinder surface, resp.

The primary shim terms correspond to the contributions of the second order spherical harmonic functions describing the mapped field distribution. The theoretical optimization of the shim sheet design yields simple geometries of 2 pieces per shim term (reference numeral 212 in FIG. 3C) for the generation of passive shim fields that approximate the corresponding spherical harmonics. However, the experimental effort for passive shimming with +Z2 and the amount of ferro-shim required for the X2-Y2, XY, and +Z2 terms can be minimized with the shim sheets 211, 213 as follows.

The shim sheet mass that was needed to generate the X2-Y2/XY fields of a given strength can be many times higher than for the other exact shim terms. This is a result of strong mutual cancellation effects that are necessary for the X2-Y2/XY field profiling. Replacement of the 2 vertical shim sheet strips 212 by 4 shim blocks 211 with vertical spacing at 180 degree intervals yields a field distribution that is a combination of X2-Y2/XY and −Z2 shim fields (FIG. 3C, X2-Y2 and XY). Due to the vertical gaps between the shim blocks 211 mutual cancellation effects are greatly reduced and the amount of shim sheet mass that is necessary to generate the same strength of the X2-Y2/XY shim field is 4.9 times smaller than that of the 2 strip line element approach.

For the +Z2 shim term, the double loop structure can be correspondingly reduced and simplified to a single loop 213 centered horizontally around the iso-center (FIG. 3C, Z2). The generated field distribution matches the theoretical target function, however, the overall accuracy of the generated shim field is reduced relative to the two-loop approach.

The reduction to two pieces per shim term in this embodiment is an important simplification of passive shimming that makes the method applicable also for passive shimming within single sessions.

The goal of the geometry design for passive shimming is to achieve both maximum accuracy and design simplicity. Based on dipole field theory and basic symmetry considerations, shim sheet geometries that would be most promising for the generation of the required fields are chosen. A cylinder geometry is preferred as basic design block to easily achieve rotational and planar symmetries. Calculations are used to validate and optimize the identity of the created shim fields and the spherical harmonic target functions.

Given the magnetic susceptibility of the shim sheet, e. g. made of permalloy, and the dimensions of the shim cylinder 210, the expected shim fields are computed for different shim geometries when placed into a homogeneous magnetic field for which the saturation state of the magnetization is reached.

The shim sheets are discretized by a finite number of finite sized volume elements and to each volume element, a dipole field is attached. The total field distortion is computed by superposition of the fields of the individual dipole fields. This dipole model has been found to produce the correct field distribution in the limit of small volume elements (see B. Muller-Bierl et al. in "Med. Phys." 2004, vol. 31(3), p. 579-87 and in "Med. Phys." 2005, vol. 32(1), p. 76-84).

The shim field distributions are calculated on a 3D data grid of size e. g. 101×101×101 voxels. The shim sheet geometries, by convention, were placed on the surface of an hypothetical cylinder with a diameter of 100 times the spacing of the point grid. Spherical harmonics are dimensionless functions, however, shim fields have physical units. Since the spatial pattern of the passive shim fields is to be analyzed and optimized, rather than particular values, first the arbitrary scaling is removed. The integral of the root mean square differences within a 3D cube volume between the magnetic field and the spherical harmonic field is determined and minimized. To this end, one optimized global linear transformation was determined for the passive shim field, i.e. a multiplication factor and an offset. The numerical routine used for minimization was stopped when relative changes of both the scaling and the offset value dropped below 0.01%, which was always achieved in less than 10 iterations. The approach could be also understood as mimicking the physical process of shimming (mounting/unmounting of shim-sheets, frequency correction).

Step 40 (Scaling Optimized Shim Terms) As the result of step 30, primary shim terms are provided, which would allow the construction of shim sheets compensating the field inhomogeneities. However, according to the invention, a further optimization is provided as follows for improving the quality of the shim fields. The primary shim terms are further adjusted (scaled) for providing optimized shim terms. This scaling is obtained by minimizing a further norm measure for the degree of similarity between the shim field generated from current shim terms and the targeted field.

As the norm measure for the degree of similarity of the (theoretical or experimental) passive shim fields $B^{passive}$ and the spherical harmonic target fields $B^{harm}$ and for the quantitative evaluation of the accuracy of the passive shim fields, a modified classical Pearson-product-moment correlation is used as follows:

$$R^2 = 1 - \left( \frac{\sum_{i=1}^{n} B_i^{passive} B_i^{harm}}{\sqrt{\sum_{i=1}^{n} (B_i^{passive})^2 \sum_{i=1}^{n} (B_i^{harm})^2}} \right)^2$$

$R^2$ represents a measure of the identity of two groups of point pairs, where offsets are considered as a decrease of similarity. The magnetic field values $B_i$ of all n spatial positions are equally weighted and the measure $R^2$ is invariant under global linear transformations (scalings, shifts). Due to the Cauchy-Schwarz inequality the quotient can have values between −1 and 1 and the modified $R^2$ value is zero for identical fields and approaches 1 when fields differ considerably. The modified $R^2$ value is a quantitative measure of identicalness, however, it is a scalar and doesn't provide any information about the type of contamination. In a further step of quality assessment the theoretically optimized shim fields can be decomposed into first to fourth order spherical harmonic functions which provide a direct measure of the type and strength of residual deviations.

For evaluation and optimization of the shim sheet geometries the centered 27×27×27 grid points (N=19683) of the full field of view are considered as the sensitive region for the $R^2$ determination, which is 27%. Cubic spline interpolation is used to determine the optimum geometry condition for which $R^2$ is minimal. The robustness of the shim fields against non-optimal dimensioning of the shim geometries is determined as the range of the $R^2$ function around the optimum geometry, for which the $R^2$ values increased less than 0.01.

Step 50 (Constructing Modular Shim Sheets)

With step 50, the modular shim sheets are constructed on the basis of the optimized shim terms scaled with step 40. For the generation of strong passive shim fields at minimized mass requirements permalloy sheets are preferably used (Ni—Fe-alloy, VAC Vacuumschmelze, Hanau/Germany). The permalloy's saturation magnetization (0.752+/−0.004 T) was reached at approximately 0.4 T without coercitivity (data not shown). The density of the metal alloy is 8.611±0.002 g/cm³. Thin pieces of maximally 10-12 mm length (e. g. 2×0.5×10 mm³) are stack-wise concatenated with adhesive tape in a contact-free manner to assemble derived larger structures, thereby minimizing the dimensions of conductive loops and the risk for the generation of eddy currents.

The measurement of the saturation magnetization of the permalloy allows the calculation of absolute passive shim fields and enables the direct comparison of theoretical optimizations and experimental results. The magnetization curve of the ferro-magnetic permalloy is saturated at an external magnetic field strength of 0.4 T. Consequently, there is no risk of memory effects at the 7 T MR device 100 for repetitive use of the shim sheets and the absolute shim fields as generated by a particular shim tube could be expected to remain unchanged. The results are valid not only for the particular metal alloy and magnetic field strength used in this study, but for all magnetic field strengths and ferromagnetic materials for which the saturation state is certainly reached. Rescaling the shim fields by the ratio of the saturation magnetizations provides a direct guide for the generation of second order shim terms and absolute strengths in other setups.

For each shim term, a set of modular shim sheet stripes or blocks of different mass is prepared before the adjustment of a new shim tube is started. The mass is selected on the basis of the following reference table (line 4) depending on the field strength to be compensated by the optimized shim terms.

| passive shim field | X2 − Y2/ XY | ZX/ZY | +Z2 (212) | −Z2 | X2 − Y2/ XY (213) | +Z2 (213) |
|---|---|---|---|---|---|---|
| $R^2_{opt}$ | 0.01 | 0.02 | 0.001 | 0.0001 | 0.01 | 0.05 |
| optimized ratio [1] | 1.20 | 0.36 | 0.24 | 0.85 | 1.01 | — |
| optimized ratio [cm] | 30.1 | 9.0 | 5.9 | 21.3 | 25.2 | — |
| theo. field/mass [Hz/(cm² · g)] | 0.054 | 2.50 | 2.11 | 1.38 | 0.27 | 4.94 |
| exp. field/mass [Hz/(cm² · g)] | 0.056 (0.001) | 2.36 (0.12) | 1.98 (0.02) | 1.26 (0.01) | 0.27 (0.01) | 4.61 (0.06) |

Furthermore, the reference table shows the shim sheet optimization results for the generation of the second order spherical harmonic shim functions. Minimum $R^2$ values <0.02 are achieved for all fields, indicating a high degree of similarity between the passive shim fields and the corresponding spherical harmonics. Based on the saturation magnetization of the permalloy used for passive shimming, quantitative field strengths are deduced theoretically and proven experimentally (line 5), in particular in phantom experiments, see below.

Step 60 (Mounting Modular Shim Sheets)

Finally, the modular shim sheets are mounted on the shim cylinder 210, e. g. by gluing on the plastic material of the tube-shaped shim cylinder wall. The passive shim cylinder 210 is adjusted once for a particular experimental setup, defined by the subject anatomy, target hemisphere, and head position. Field mapping with FASTMAP is used to quickly measure the field distortions in terms of the required shim fields. The subject is taken out of the magnet and modular shim sheets are mounted on the shim cylinder 210 based on the requirements.

Embodiment of an Adjusting Method Using the Shim Sheets

For adjusting the magnetic field in the MR device 100 by passive shimming, the shim cylinder 210 is set into the MR device 100 (see FIG. 1) for MR imaging or spectroscopy. MR imaging or spectroscopy is conducted using the adjustment device 200 with the shim cylinder 210, wherein the MR device is controlled according to conventional procedures. The passive shimming can be combined with conventional active shimming for a homogenization of the magnetic field, in particular the z-component of the magnetic field.

Experimental Validation of Passive Shim Fields on a Gel Phantom

Figure 4:
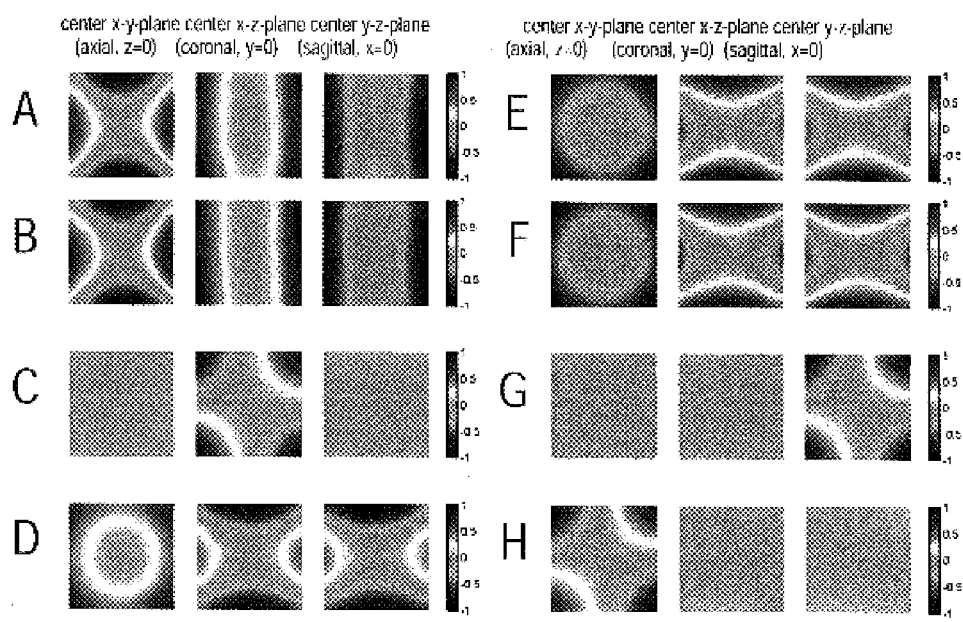
FIGS. 4 and 5: experimental results obtained with an adjustment device according to the invention.

Based on the quantitative optimization results, the theoretically derived field patterns and strengths were experimentally controlled on an agar gel phantom. A 27×27×27 mm$^3$ field of view was used, corresponding to 11% of the 25 cm tube diameter of the shim cylinder 210. The passive shim field was determined from the condition of the mounted shim cylinder 210 minus the field distribution without the shim cylinder 210 which was fitted into first and second order spherical harmonics and removed by postprocessing. Phantom field mapping confirmed the theoretical optimization results of all shim fields and polarities. A gradient echo FLASH imaging sequence with an isotropic resolution of 1 mm at 7/9.5 ms echo time was used to measure the field distributions from a 27×27×27 mm$^3$ cube voxel (11% field of view, shim cylinder diameter 25 cm). The second order spherical harmonics were well approximated by the passive shimming. Modified R$^2$ values below 0.02 were achieved in all cases, and deviations from the target field distributions were small as illustrated in FIG. 4 (A: X2-Y2 with 2 strips 212, B: X2-Y2 with 4 blocks 211, C: ZX, D: −Z2, E: +Z2 with 2 loops 212, F: +Z2 with 1 loop 213, G: ZY, H: XY, compare FIG. 3C).

Experimental Validation of Shimming for $^1$H MR Spectroscopy of the Macaque Visual Cortex at 7 Tesla The improvement of the achievable magnetic field homogeneity by combined passive and active shimming of the macaque monkey brain in vivo was addressed by quantitative field mapping.

Figure 5:
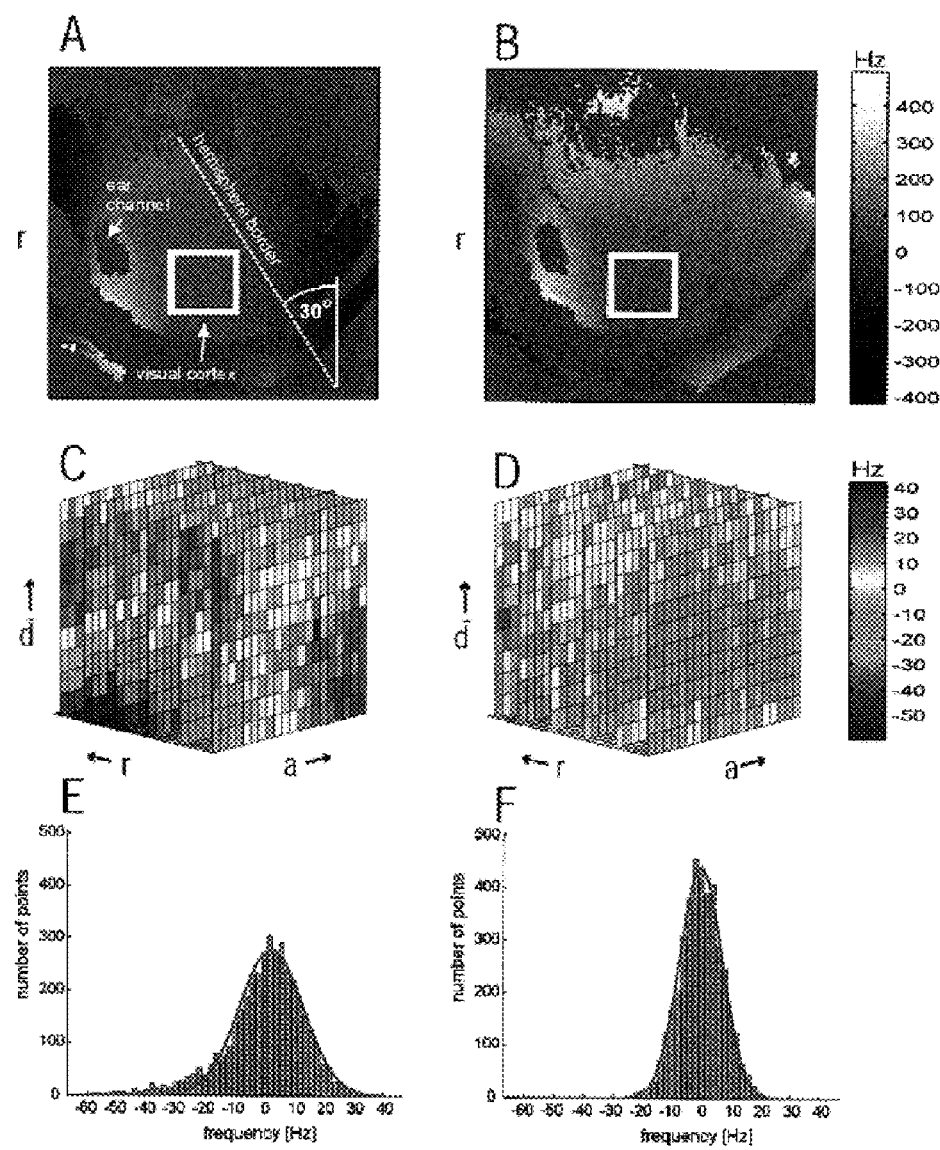

FIG. 5 illustrates the comparison of the combined passive and active shimming to constrained active shimming only. Axial field maps from the 30 degrees rotated monkey head of the constrained (FIG. 5A) and of the combined (FIG. 5B) shimming are depicted (a: anterior, r: right, d: dorsal). The shimming volume of 10×10×10 mm$^3$, placed into visual cortex gray and white matter, is indicated by the white box. Decomposition of the shimming volume's field distribution into spherical harmonics revealed second order terms of X2-Y2: 3.9 Hz/cm$^2$, ZX: −19.0 Hz/cm$^2$, Z2: −75.0 Hz/cm$^2$, ZY: 33.6 Hz/cm$^2$, XY: −3.3 Hz/cm$^2$. First and second order field decomposition of at least five field maps per shim channel in a previous phantom study provided the full correlation matrix of the currently installed AC44 shimming device. Linear regression of the data points yielded maximum shim field strengths of X=589 Hz/cm, Z=587 Hz/cm, and Y=511 Hz/cm for the linear shim terms and X2-Y2=1.86 Hz/cm$^2$, ZX=3.74 Hz/cm$^2$, Z2=5.21 Hz/cm$^2$, ZY=3.69 Hz/cm$^2$, XY=1.84 Hz/cm$^2$ for the second order ones at correlation coefficients >0.98 in all cases. Considering the interdependencies of the shim channels for all 8 first and second order terms, the absolute field distortions translated to relative shim field requirements of X2-Y2: 365%, ZX: −465%, Z2: 1540%, ZY: −970%, XY: −130% with respect to the currently available active shim power.

Field deviations of several hundred Hertz remained over the brain after active shimming only (FIG. 5A). Simple mounting of the shim tube, which had been adjusted in a previous session six weeks before, was enough to remove the main field inhomogeneities and to permit optimal first and second order active shimming. Although the shimming was focused on improving the homogeneity within the localized 10×10×10 mm$^3$ cube volume inside the brain, the major large scale field fluctuations were considerably reduced (FIG. 5B). Strong frequency variations with a range of 100 Hz remained within the shimming volume after constrained active shimming, whereas the frequency spread was reduced by a factor of two in this case with combined passive and active shimming. Maximum frequency differences were about 100 Hz in the purely actively shimmed voxel (FIG. 5C) and reduced by a factor of 2 after the combined shimming (FIG. 5D). The FWHM of the Gaussian fitted frequency distribution was reduced from 25.4 Hz to 17.0 Hz (FIG. 5E/F).

The features of the invention disclosed in the above description, the drawings and the claims can be of significance both individually as well as in combination for the realization of the invention it its various embodiments.

The invention claimed is:

1. Method of providing shim sheets for adjusting a magnetic field in a magnetic resonance device by passive shimming, comprising the steps of:
   field mapping of a region of interest in the MR device for obtaining an uncorrected magnetic field distribution including field inhomogeneities,
   decomposing the field inhomogeneities into first and second order spherical harmonic functions,
   determining primary shim terms derived from the second order spherical harmonic functions, wherein the primary shim terms yield a passive shim field adapted to a targeted shim field,
   scaling optimized shim terms for increasing a similarity of the passive shim field with the targeted shim field,
   constructing modular shim sheets on the basis of the optimized shim terms, and
   mounting the modular shim sheets on a shim sheet carrier.

2. Method according to claim 1, wherein the primary shim terms are derived from X2-Y2, ZX, Z2, ZY and XY components of the spherical harmonic functions.

3. Method according to claim 2, wherein the step of constructing the modular shim sheets comprises constructing at least one of:
   at least one strip sheet corresponding to at least one of the X2-Y2 and XY components of the spherical harmonic functions,
   at least one circle sheet corresponding to the Z2 component of the spherical harmonic functions, and
   at least one quarter-circle sheet corresponding to at least one of the ZX and ZY components of the spherical harmonic functions.

4. Method according to claim 3, wherein the at least one strip sheet is constructed corresponding to a combination of the at least one of the X2-Y2 and XY components and a -Z2 component of the spherical harmonic functions.

5. Method according to claim 3, wherein a single circle sheet is constructed corresponding to the Z2 component of the spherical harmonic functions.

6. Method according to claim 3, wherein the step of constructing the modular shim sheets comprises:
   selecting optimized masses of the at least one of the strip sheet, the circle sheet and the quarter-circle sheet.

7. Method according to claim 6, wherein the optimized masses are selected from a reference table.

8. Method according to claim 6, wherein the step of constructing the modular shim sheets comprises:
providing a plurality of sheet layers corresponding to the selected optimized masses, and
sandwiching the sheet layers for obtaining the modular shim sheets.

9. Method according to claim 8, wherein the step of providing the sheet layers comprises:
selecting at least one of a sheet layer thickness and a sheet layer thicknesses distance.

10. Method according to claim 1, comprising the step of calculating the passive shim field with the sub-steps of:
discretizing the shim terms by a finite number of finite sized volume elements,
attaching a dipole field to each volume element, and
calculating the passive shim field as a superposition of the fields of the individual dipole fields.

11. Method according to claim 10, comprising the step of varying the primary shim terms such that the related passive shim field is adapted to the targeted shim field.

12. Method according to claim 1, wherein the step of scaling optimized shim terms comprises:
calculating a quantitative norm of similarity of the passive shim field with the targeted shim field, and
iterative varying the primary shim terms until the quantitative measure has got a predetermined optimum.

13. Method according to claim 12, comprising the further step of:
calculating a value $R^2$ according to $$R^2 = 1 - \left( \frac{\sum_{i=1}^{n} B_i^{passive} B_i^{harm}}{\sqrt{\sum_{i=1}^{n} (B_i^{passive})^2 \sum_{i=1}^{n} (B_i^{harm})^2}} \right)^2$$

with $B^{passive}$ representing current passive shim fields and $B^{harm}$ representing the targeted shim field at n spatial positions, wherein the predetermined optimum has got if $R^2$ has a minimum value.

14. Method according to claim 1, wherein the modular shim sheets are mounted on a cylindrical shim sheet carrier.

15. Method according to claim 1, comprising the further step of correcting the magnetic field in the MR device by active shimming.

16. Method of adjusting a magnetic field in a magnetic resonance device by passive shimming, comprising the steps of:
providing a shim sheet carrier with modular shim sheets with a method according to claim 1, and
operating the magnetic resonance device with the shim sheet carrier surrounding a sample under investigation.

17. Adjustment device for adjusting a magnetic field in a magnetic resonance device by passive shimming, comprising:
a plurality of modular shim sheets constructed on the basis of X2-Y2, ZX, Z2, ZY and XY components of spherical harmonic functions representing field inhomogeneities in the MR device, and
a carrier supporting the modular shim sheets, wherein
the modular shim sheets comprise at least one of:
at least one strip sheet corresponding to at least one of the X2-Y2 and XY components of the spherical harmonic functions,
at least one circle sheet corresponding to the Z2 component of the spherical harmonic functions, and
at least one quarter-circle sheet corresponding to at least one of the ZX and ZY components of the spherical harmonic functions.

18. Adjustment device according to claim 17, wherein the at least one strip sheet is constructed corresponding to a combination of the at least one of the X2-Y2 and XY components and a −Z2 component of the spherical harmonic functions.

19. Adjustment device according to claim 17, wherein the modular shim sheets comprise corresponding to the Z2 component of the spherical harmonic functions a single circle sheet.

20. Adjustment device according to claim 17, wherein each of the modular shim sheets comprises at least one sheet layer.

21. Adjustment device according to claim 20, wherein at least one of the modular shim sheets comprises a stack of sheet layers.

22. Adjustment device according to claim 17, wherein the modular shim sheet comprise permalloy sheets.

23. Adjustment device according to claim 17, wherein the carrier has a cylindrical shape.

24. Magnetic resonance device including an adjustment device according to claim 17.

* * * * *